(12) United States Patent
Prosandeev et al.

(10) Patent No.: US 7,835,168 B2
(45) Date of Patent: Nov. 16, 2010

(54) ASYMMETRIC DIPOLAR RING

(75) Inventors: Sergey A. Prosandeev, Fayetteville, AR (US); Inna V. Ponomareva, Tampa, FL (US); Igor A. Kornev, Ill-de-France (FR); Laurent M. Bellaiche, Fayetteville, AR (US)

(73) Assignee: Board of Trustees of the University of Arkansas, Little Rock, AK (US)

( * ) Notice: Subject to any disclaimer, the term of this patent is extended or adjusted under 35 U.S.C. 154(b) by 169 days.

(21) Appl. No.: 12/316,858

(22) Filed: Dec. 17, 2008

(65) Prior Publication Data

US 2009/0161404 A1 Jun. 25, 2009

Related U.S. Application Data

(63) Continuation-in-part of application No. 11/811,444, filed on Jun. 8, 2007, now Pat. No. 7,593,250, which is a continuation-in-part of application No. 11/151,088, filed on Jun. 13, 2005, now abandoned.

(60) Provisional application No. 60/580,940, filed on Jun. 18, 2004, provisional application No. 60/632,040, filed on Dec. 1, 2004.

(51) Int. Cl.
*G11C 11/22* (2006.01)
(52) U.S. Cl. ...................................... 365/145; 365/171
(58) Field of Classification Search ........................ None
See application file for complete search history.

(56) References Cited

U.S. PATENT DOCUMENTS

2004/0195542 A1* 10/2004 Bellaiche et al. ........ 252/62.9 R

OTHER PUBLICATIONS

Chien, C., et al., Patterned nanomagnets, Physics Today, pp. 40-45, Jun. 2007.
Zhu, F., et al., Magnetic Bistability and Controllable Reversal of Asymmetric Ferromagnetic Nanorings, Phys. Rev. Ltrs. 96, pp. 027205-1-027205-4, Jan. 17, 2006.
Prosandeev, S., et al., Original properties of dipole vortices in zero-dimensional ferroelectrics, J. Phys.: Condens. Matter 20 (2008) 193201, pp. 1-14, Apr. 8, 2008.
Prosandeev, S., et al., Controlling Double Vortex States in Low-Dimensional Dipolar Systems, Phys. Rev. Ltrs. 101, pp. 097203-1-097203-4, Aug. 26, 2008.
Prosandeev, S., et al., Order parameter in complex dipolar structures: Microscopic modeling, Phys. Rev. B 77, pp. 060101-1-060101-4, Feb. 7, 2008.
Prosandeev, S., et al., Tensors in ferroelectric nanoparticles: First-principles-based simulations, Phys. Rev. B 76, pp. 012101-1-012101-4, Jul. 6, 2007.
Prosandeev, S., et al., Control of Vortices by Homogeneous Fields in Asymmetric Ferroelectric and Ferromagnetic Rings, Phys. Rev. Ltrs. 100, pp. 047201-1-047201-4, Jan. 28, 2008.

* cited by examiner

*Primary Examiner*—Huan Hoang
*Assistant Examiner*—James G Norman
(74) *Attorney, Agent, or Firm*—Ray F. Cox, Jr.

(57) ABSTRACT

A device having a dipolar ring surrounding an interior region that is disposed asymmetrically on the ring. The dipolar ring generates a toroidal moment switchable between at least two stable states by a homogeneous field applied to the dipolar ring in the plane of the ring. The ring may be made of ferroelectric or magnetic material. In the former case, the homogeneous field is an electric field and in the latter case, the homogeneous field is a magnetic field.

13 Claims, 5 Drawing Sheets

ASYMMETRIC DIPOLAR RING

CROSS-REFERENCE TO RELATED APPLICATIONS

This is a continuation-in-part of U.S. patent application Ser. No. 11/811,444 filed Jun. 8, 2007now U.S. Pat. No. 7,593,250, which is a continuation in part of U.S. patent application Ser. No. 11/151,088 filed Jun. 13, 2005 now abandoned, which claims the benefit of U.S. Provisional Application No. 60/580,940 filed Jun. 18, 2004 and U.S. Provisional Application No. 60/632,040 filed Dec. 1, 2004, all of the disclosures of which are incorporated herein by reference in their entireties.

STATEMENT REGARDING FEDERALLY SPONSORED RESEARCH OR DEVELOPMENT

This invention was made with Government support under the terms of Grant No. DE-FG02-05ER46188 awarded by the Department of Energy, Grant No. N00014-04-1-0413 awarded by the Office of Naval Research, Grant Nos. DMR-0701958, DMR-0404335 and DMR-0080054(C-SPIN) awarded by the National Science Foundation and MRI Grant Nos. 0421099 and 0722625 from the National Science Foundation. The Government has certain rights in the invention.

BACKGROUND OF THE INVENTION

Vortex states, in which the dipoles form a closure structure, have been discovered in small magnetic disks in the last seven years (see, e.g., Ref. [1] and references therein). Also see U.S. patent application Ser. Nos. 11/811,444; 11/151,088; 60/580, 940; and 60/632,040, all of the disclosures of which are incorporated herein by reference in their entireties. Interestingly, vortex structures have also been recently predicted in another kind of dipolar system of high importance, namely ferroelectrics [2]—when these latter are of nanoscale size and under open-circuit electric boundary condition [3] (i.e., for no or small screening of the polarization-induced surface charges). The existence of these vortices holds tremendous promise for nanotechnology. However, in order to fulfill such promise, one has to solve the challenging problem of controlling the vortices' chirality. As a matter of fact, magnetic and electric vortices cannot directly couple with homogeneous magnetic and electric fields [4-7]. Alternative methods have thus been suggested for such control, ranging from simultaneously applying an electric and a magnetic field and taking advantage of their cross-product [4] to the use of inhomogeneous fields [2,6]. Unfortunately, these methods are by no means trivial. This explains why the recent observation that the chirality of vortices can be switched by applying a homogeneous magnetic field in asymmetric magnetic disks is an important breakthrough (see Ref. [1] and references therein). Moreover, this switching involves peculiar intermediate states, namely the so-called onion states, which makes it even more interesting (onion states consist of two domains with semicircular magnetizations of different helicity [8]). However, this recent observation also raises many important questions. For instance, the fundamental reason behind such switching is a mystery. Similarly, the precise role of the shape's asymmetry on that control remains unexplained. Furthermore, it is worthwhile to know if a homogeneous electric field can also affect the magnitude of electric vortices and switch their chirality in (asymmetric) ferroelectrics—which will make the control of vortices by homogeneous field a general phenomena in (asymmetric) dipolar systems. If such possibility indeed occurs, determining if onion, or even other, intermediate states are also involved in that switching is of high interest.

Fabrication of asymmetrical magnetic rings [1, 18] has been reported.

BRIEF SUMMARY OF THE INVENTION

The present invention relates to magnetic and ferroelectric devices. A multi-stable vortex structure has been found in nanostructures, but the effective control of this structure has been limited to the use of inhomogeneous electric fields. The present invention allows effective control of the desired directions of the dipole vortices. Ferroelectric and magnetic discs having an asymmetrically placed interior region allow one to use a homogeneous electric field (for ferroelectrics) and a homogeneous magnetic field (for magnets) to effectively change the chirality of the dipole structure. This facilitates the control of the dipole vortices, for example, for use in devices for saving information in nonvolatile memory elements. The device may be made from, for example, PZT, a known material for piezoelectric transducers, or permalloy, a known magnetic material.

These and other features, objects and advantages of the present invention will become better understood from a consideration of the following detailed description of the preferred embodiments and appended claims in conjunction with the drawings as described following:

BRIEF DESCRIPTION OF THE SEVERAL VIEWS OF THE DRAWINGS

FIGS. 1A and 1B display the behavior of the magnetization and magnetic toroidal moment, respectively, as a function of the applied homogeneous ac magnetic field. FIGS. 1C and 1D show the evolution of the polarization and electric toroidal moment, respectively, versus the applied homogeneous ac electric field. The insets illustrate the rings' geometry and the dipole arrangement in the (x,y) plane for the states (i)—where (i) ranges from 1 to 8 as described below.

DETAILED DESCRIPTION OF THE INVENTION

Figure 1A:
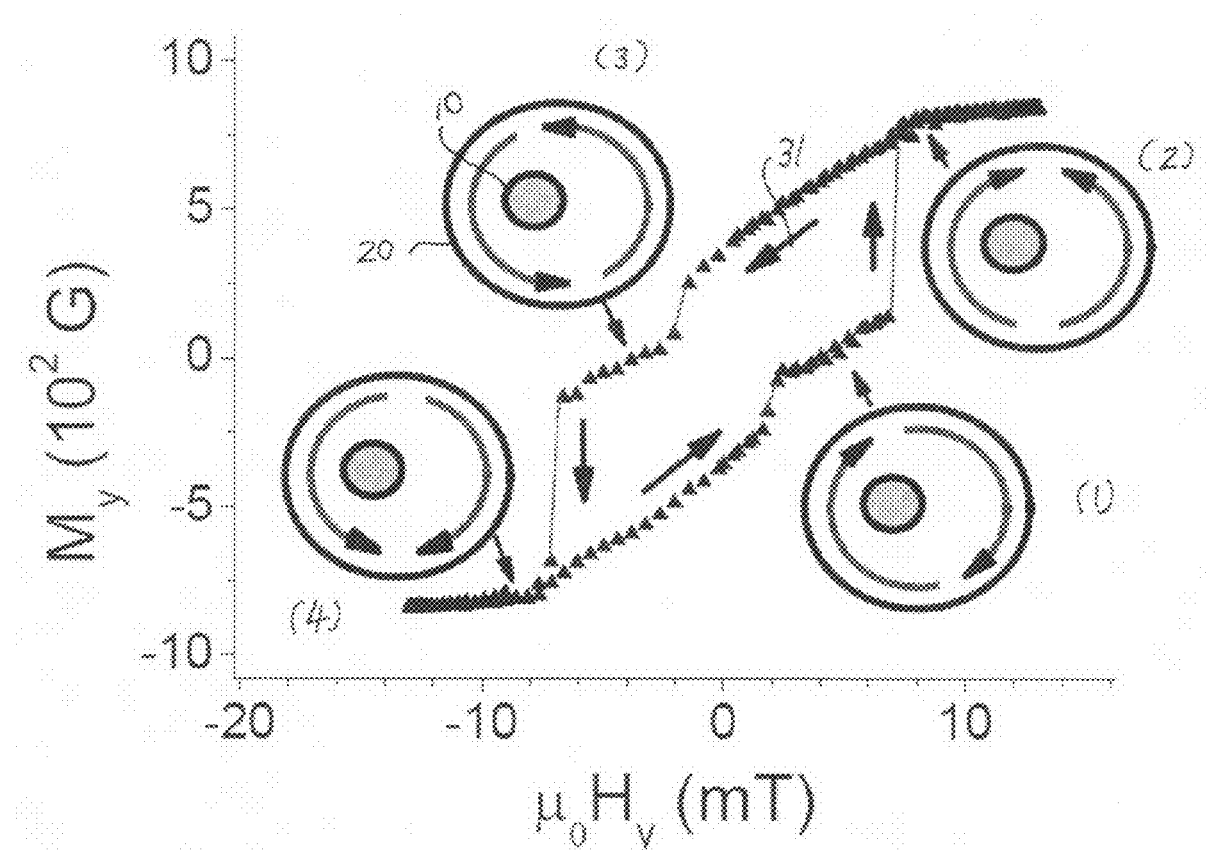
FIGS. 1A-1D are graphs of the predicted hysteresis loops in asymmetric ferromagnetic rings (FIGS. 1A and 1B) and in asymmetric ferroelectric rings (FIGS. 1C and 1D).
Figure 1B:
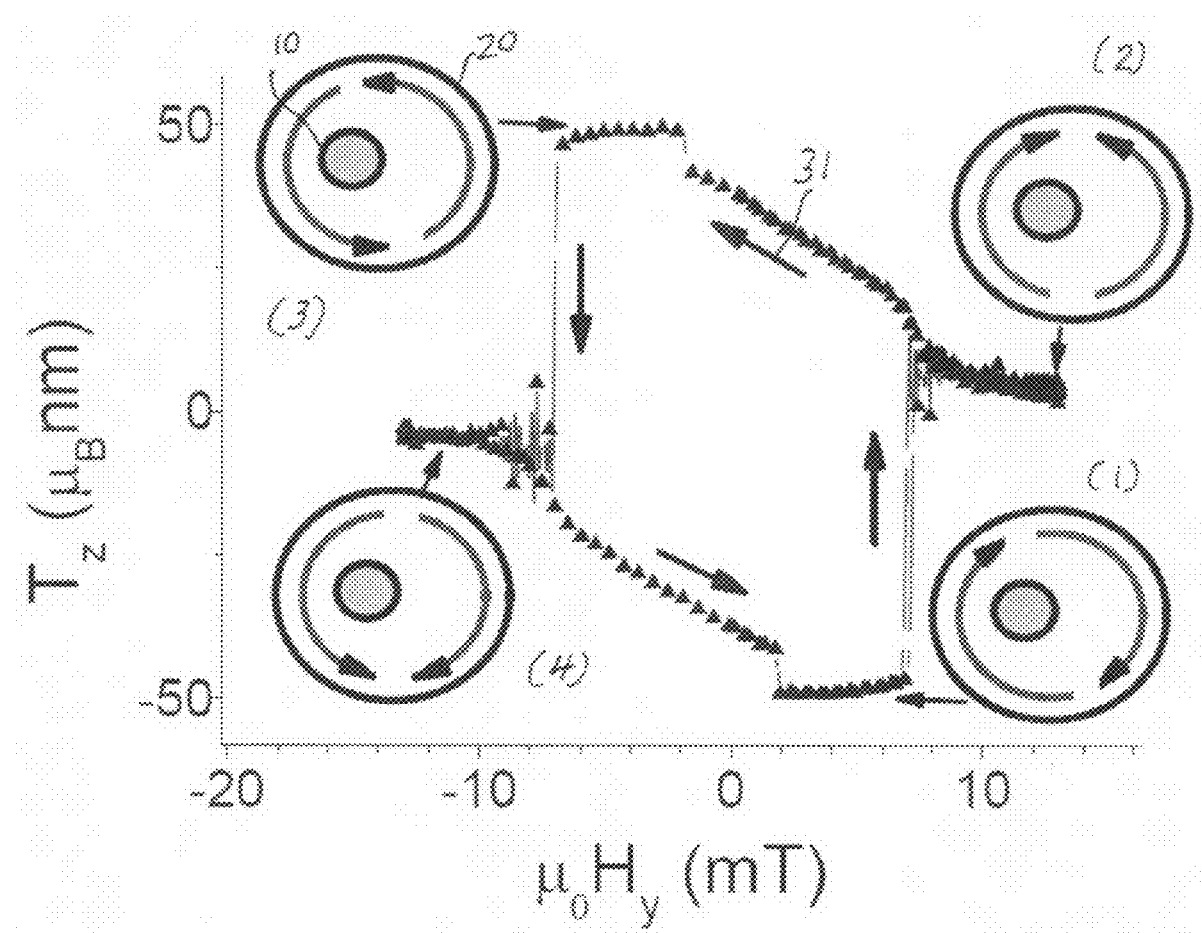
Figure 1C:
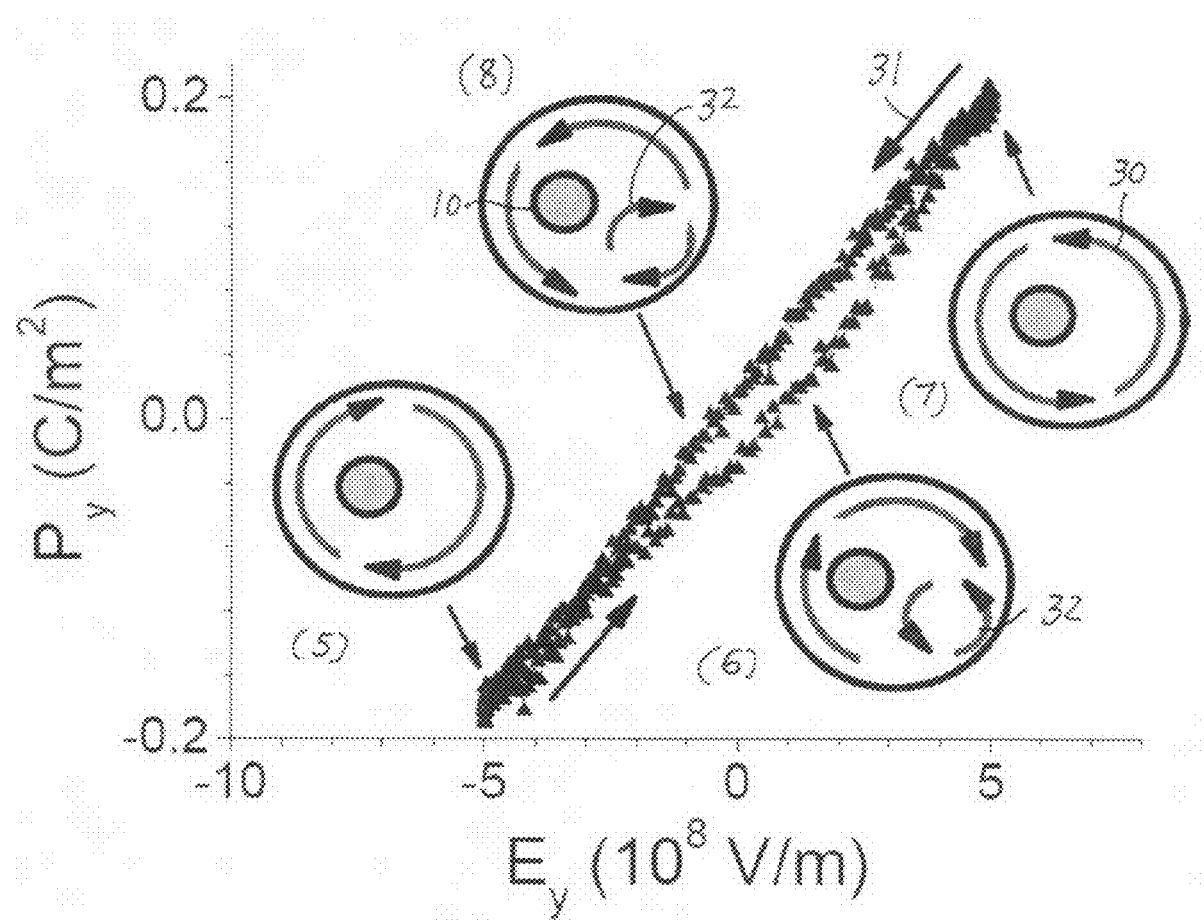
Figure 1D:
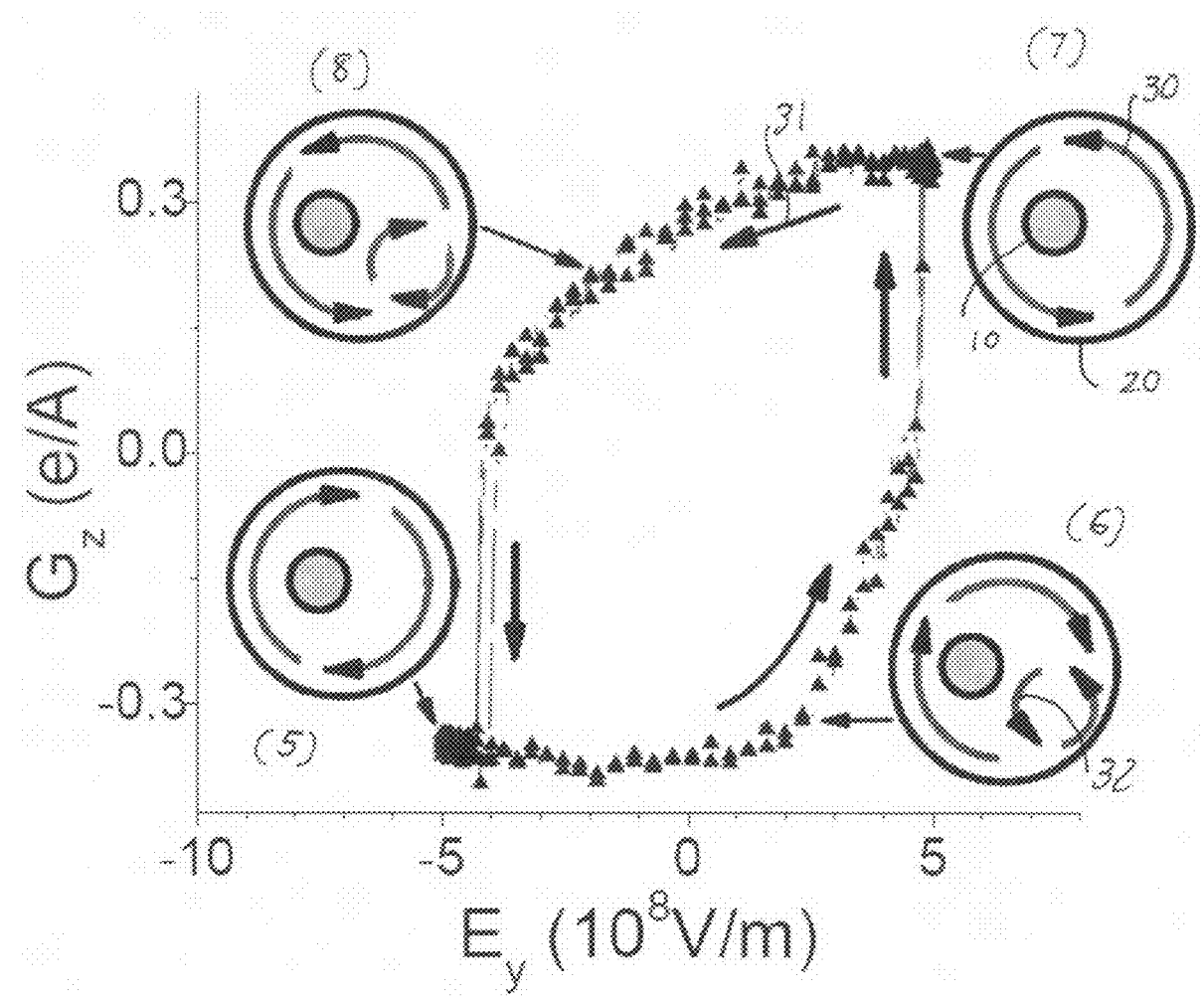
Figure 2:
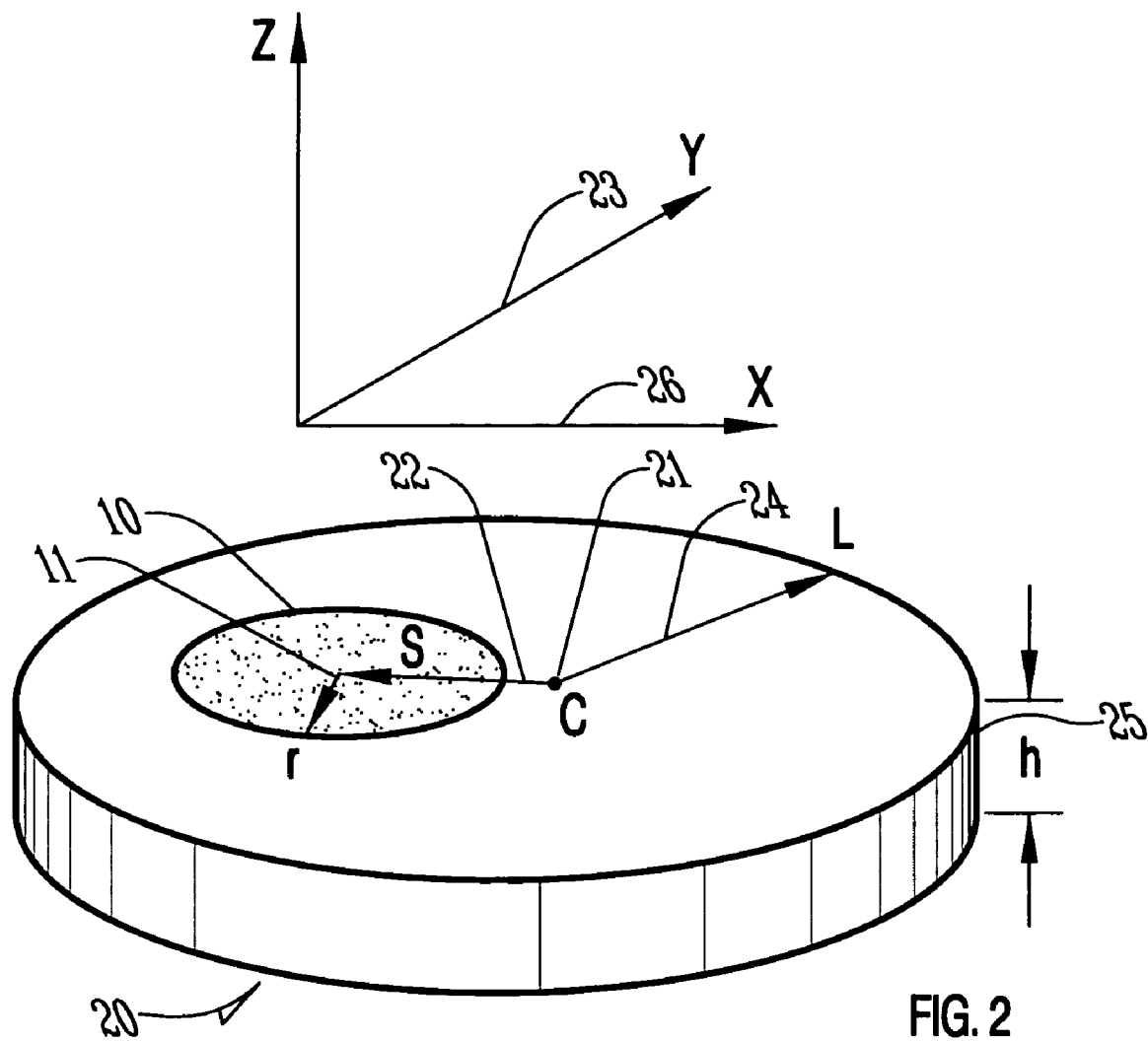
FIG. 2 is a schematic illustration of a device allowing effective control of the dipole structure in an asymmetrical dipolar ring.

With reference to FIGS. 1A-2, the preferred embodiments of the present invention may be described.

As shown in FIG. 2, the present invention is a device with an asymmetrical interior region 10 in a ferroelectric or magnetic dipolar ring 20 making it possible to use a homogeneous field in the plane of the ring 20 to control the dipole vortices. FIG. 2 illustrates the geometry of the device. The interior region 10 is positioned asymmetrically on the ring 20. The ring 20 is made of a ferroelectric material (for a ferroelectric device) and of a magnetic material (for a magnetic device). The interior region 10 can be filled in with nonferroelectric (for ferroelectrics) and nonmagnetic (for magnets) material or formed as a vortex ring of polarization as described in U.S. patent application Ser. Nos. 11/811,444; 11/151,088; 60/580, 940; and 60/632,040. The letters in FIG. 2 denote the geometrical parameters. Letter C denotes the position of the geometrical center 21 of the ring 20. The vector 22 denoted by S is perpendicular to the direction of the field. The cross-product of the R vector and the applied field is directed perpendicular to the plane of the ring 20 and transforms in the same manner as the toroidal moment characterizing the dipole vortex. Due to the fact that the toroidal moment is a mathematical characteristic of the vortex chirality, this cross-product is the driving field allowing change in the direction of the desired direction (chirality) of the dipole vortex in the asymmetric ring 20. In ferroelectrics or magnets, when applying the field along the y axis 23 and then when vanishing this field, the dipole vortex structure is clockwise. The opposite direction of the field stabilizes the anticlockwise direction.

The ferroelectric asymmetrical ring 20 is desirably made so that the external radius 24, denoted by L, is larger than, but on the order of, 4 nm. Normally, the height 25, denoted by h, must be smaller than L and the lattice anisotropy in the ring 20 should be so as to favor the in-plane dipole vortex structure (plane anisotropy). The size of the interior region 10, that is the internal radius 11, denoted as r, should be smaller than L/2. The interior region 10 should be placed so to leave some place in the ring 20 for the continuous flux of the dipoles. If the interior region 10 is shifted from the geometrical center 21 of the ring 20 along the x axis 26 (as shown in FIG. 2), then one can apply a homogeneous electric field along the y axis 23 so to manipulate the direction of the vortex (the vortex chirality). The direction of the field is tightly connected with the chirality of the dipole vortex.

FIG. 1D describes the physics of the switching of the vortex dipole structure in a ferroelectric asymmetrical dipolar ring 20 with an asymmetrically placed interior region 10 as described in more detail below. The insets illustrate the dipole structure in the asymmetrical ring 20. The arrows 30 show the direction of the dipoles in the plane of the ring 20. The interior region 10 in shown positioned asymmetrically in the ring 20. The calculated quantity is the toroidal moment G. The largest positive values of $G_z$ correspond to the counter-clockwise direction of the dipole in the vortex, which is illustrated in the top-right corner inset. The negative values correspond to the clockwise direction shown in the left-bottom corner inset. The arrows 31 inside the calculated loop show the direction of the change of the field and corresponding change of the toroidal moment. When applying the field, a nucleus of a new vortex 32 appears. At first, the two vortices coexist as shown in the left-top inset. Finally, there exists a jump of the toroidal moment illustrating the abrupt substitution of the two-vortex structure by a new vortex structure shown in the left-bottom inset. Thus the application of the homogeneous field to an asymmetric ring 20 is capable of changing the direction of the vortex.

FIG. 1B illustrates the results of our calculation of the magnetic toroidal moment T. FIG. 1B shows the dependence of the magnetic toroidal moment calculated for a magnetic asymmetrical disc on the magnitude of the magnetic field. The insets illustrate the magnetic dipole structure calculated for different values of the magnetic field. The arrows 30 in the insets point out the direction of the dipoles in the dipole structures calculated. The interior region 10 is shown asymmetrically positioned in the magnetic ring 20. The arrows 31 inside the loop show the direction of the change of the toroidal moment together with the change of the magnetic field. The largest values of the toroidal moment correspond to the counter-clockwise direction of the dipoles in a vortex structure. When applying the field opposite to axis y, the dipoles change their pattern to the so-called onion state illustrated in the left-bottom inset. Then when vanishing the field, the equilibrium dipole pattern is again presented by a vortex, but in this case with the clockwise direction of the dipoles, as this is shown, in the right-bottom inset. Thus applying the field allows one to change the chirality of the dipole pattern from the anticlockwise to clockwise direction. Similarly one can change the clockwise direction of the dipoles to counter-clockwise by applying the held in the opposite direction as this is shown in FIG. 1B.

The following discussion details the calculations used in the preparation of FIGS. 1A-1D.

The height 25, and internal and external radii 11, 24 about the z-axis (that lies along the [001] pseudo-cubic direction) of our investigated rings 20 are denoted by h, r and L, respectively. Moreover, the center of the internal radius in any (001) plane is allowed to shift along the x-axis (that lies along the [100] pseudo-cubic direction) from the center of the external radius by a distance, to be called S.

The use of fully atomistic techniques to simulate vortex states in magnets is not currently feasible since these states only occur in magnetic systems that possess a large enough size (e.g., in disks with diameters of thousands of nm [9]). As an alternative, we describe here a hybrid approach that combines both atomistic and continuum features to study ferromagnetic rings. Technically, the simulated system is divided into equal regions (cells) of $b^3$ volume—with b=na, where a is the material primitive lattice constant and n is an integer. The total magnetic moment of any of such cell j, $\mu_j$, is equal to the sum of the $m_{i,j}$ local magnetic moments of the magnetic atoms i belonging to that cell j, with the assumption that the $m_{i,j}$ all have the same magnitude and direction inside a given cell j [10]. The total energy of the ferromagnetic ring is given by:

$$E_{magn} = \tfrac{1}{2}\Sigma_{jk\alpha\beta} D_{jk,\alpha\beta}\mu_{j\alpha}\mu_{k\beta} - \mu_0 H \cdot \Sigma_j \mu_j + \tfrac{1}{2} J' \Sigma_{jk\alpha} \mu_{j\alpha}\mu_{k\alpha} \quad (1)$$

where the sums run over the cells j and k and over the Cartesian components α and β. Note that the last sum over k runs over the first nearest neighbors of the cells j, that $\mu_0 H$ is the applied magnetic field (with po being the permeability of the vacuum), and that $D_{jk,\alpha\beta}$ is the tensor associated with the long range magnetic dipole-dipole interactions. Practically $D_{jk,\alpha\beta} = \mu_0 [\delta_{\alpha,\beta} R^2_{jk} - 3(R_{jk\alpha} R_{jk\beta})/(4\pi R^5_{jk})]$, with $R_{jk\alpha}$ being the α component of the vector $R_{jk}$, joining the centers of the jth and kth cells. This Hamiltonian thus has three terms that correspond, respectively, to (i) the long range dipole-dipole interactions between the $\mu_j$ belonging to the different cells; (ii) the interaction between these $\mu_j$ and an ac homogeneous-in-space magnetic field [11]; and (iii) the nearest-neighbor exchange interaction between the $\mu_j$. This effective Hamiltonian is then used to solve the Landau-Lifshitz Molecular Dynamics equations [11] for all the $\mu_j$. The exchange interaction parameter between the $\mu_j$ is estimated from the usual material exchange parameter A as $J'=Aa/(n^5|m_{i,j}|^2)$, which yields the correct linear scaling of short-range energy with n, since the $\mu_j$ scale as $n^3$ [9]. Here, we principally focus on a magnetic ring with h≈250 nm, L≈1056 nm, r≈417 nm and S≈167 nm, under a magnetic field of 0.6 MHz frequency and applied along the y-axis. Practically, this ring is divided into cubic cells defined by b≈83 nm. We chose permalloy 80 (i.e., $Ni_{80}Fe_{20}$) for the material forming the ring by adopting the parameters [9] $A=1.3\times10^{-6}$ erg/cm, $|m_{i,j}|=0.205\mu_B$ (where $\mu_B$ is the Bohr magneton) and a≈3 Å.

Regarding ferroelectric dots, we chiefly consider an asymmetric nanoring made of $Pb(Zr_{0.4}Ti_{0.6})O_3$ (PZT) with h=24 Å, L=32 Å, r=8 Å and S=12 Å. It is chosen to be stress-free and under open-circuit electrical boundary conditions, and to have Pb—O terminated-surfaces. (PZT nanodots, with such L, h and boundary conditions, exhibit an electrical dipole vortex for their ground-state [2,3,7]). Its total energy is provided by the first-principles-based scheme of Refs. [6,12] that generalizes to nanodots made of PZT the alloy effective Hamiltonian method proposed in Ref. [13] for bulks, by (i) substituting the dipole-dipole interaction of three-dimensional systems by the corresponding interaction in nanodots; and (ii) incorporating surface-induced relaxations that are caused by the vacuum surrounding the dot with the governing parameters having been fifted to first-principles calculations on PZT slabs [14]. The total energy of this scheme is used in molecular dynamics (MD) to obtain the dipole configurations of the studied ferroelectric nanosystem under an ac homogeneous electric field of 10 GHz frequency [15, 16] and applied along the y-axis. These MD simulations correctly reproduce the transition temperatures obtained when using the alloy effective Hamiltonian scheme within Monte-Carlo techniques [13], and also provide a good agreement with experiments for the soft mode frequency in bulk PZT [17].

FIGS. 1A and 1B display the $M_y$-versus-$\mu_0 H_y$ and $T_z$-versus-$\mu_0 H_y$ hysteresis loops of the studied asymmetric ferromagnetic ring, respectively, at a simulated temperature≈100 K. $\mu_0 H_y$ is the y-component of the applied magnetic field, and is allowed to vary in time between −10 and +10 mT. $M_y$ is the y-(and sole) component of the magnetization in the nanoring while T is the z-(and sole) component of the so-called T magnetic toroidal moment [4]—that is, $T=(\frac{1}{2}V) \Sigma_i R_i \times \delta\mu_i$, where V is the volume of the system, $R_i$ is a vector locating the site i of the ring, and $\delta\mu_i$ represents the difference between the magnetic dipole moment at site i and the average (over all the sites) magnetic dipole moment. Insets in FIGS. 1A and 1B provide a schematization of the magnetic dipole arrangement in the four important states predicted by our simulations, that are: state (1) which is a vortex state characterized by a significantly negative $T_z$ and vanishing $M_y$; state (2) which is an "onion" state that exhibits a positive $M_y$ of ≈885G with no toroidal moment, and that occurs for the largest positive values of $H_y$; state (3) that is a vortex state that differs from state (1) by adopting an opposite chirality (since its $T_z$ is positive); and state (4) that forms an onion state that differs from state (2) by the sign of $M_y$ and of the $H_y$ values at which it exists. FIGS. 1A and 1B thus confirm that a homogeneous magnetic field is able to control the chirality of magnetic vortices in asymmetric ferromagnetic rings, via the transition into intermediate onion states [1]. We did not find any such controllable switching of the vortex chirality in symmetric nanorings (that is for which S=0) under homogeneous magnetic fields—which undoubtedly indicates that asymmetry is of crucial importance for the switching of the vortex chirality by a homogenous field. Moreover, FIGS. 1A and 1B also further reveal that the formation of the onion states (2) or (4) from the vortex states (1) or (3), respectively, is accompanied by a large jump of $M_y$ and $T_z$. On the other hand, the pure onion states (2) or (4) first "deform" themselves under the influence of the homogeneous magnetic field before transforming into the pure vortex states (3) or (1) via small jumps of $M_y$ and $T_z$. (These deformations mostly consist in pushing the wall between the two kinds of magnetized domains forming the onion state towards the thinner part of the asymmetric ring (i.e., towards the left side of the inner radius), as consistent with Refs. [1, 16, 18].) Such features lead to rather unusual $M_y$-versus-Hy and $T_z$-versus-$H_y$ hysteresis loops in asymmetric ferromagnetic rings. Interestingly, such an unusual $M_y$-versus-$H_y$ loop has been observed in asymmetric magnetic rings [1, 18], which reveals that our microscopic scheme can capture with high accuracy striking phenomena occurring in low-dimensional magnets. The associated $T_z$-versus-$H_y$ hysteresis loop quantifies the control of the vortex's chirality and magnitude by a homogeneous magnetic field.

Let us now focus on asymmetric ferroelectric nanorings. FIGS. 1C and 1D display the behavior of the y-component of the polarization ($P_y$) and of the z-component of the electric toroidal moment ($G_z$) of the investigated asymmetric ferroelectric nanoring as a function of the y-component of the electric field ($E_y$), respectively, at a simulated temperature of 300 K. Practically, $E_y$ varies between −5×10$^8$ V/m and +5×10$^8$ V/m depending on the simulated time, and G=($\frac{1}{2}$V) $\Sigma_i r_i \times \delta p_i$, where V is the volume of the system, $r_i$ is a vector locating the site i of the nanoring, and where $\delta p_i$ is the difference between the electric dipole moment at the i site and the electric dipole moment averaged over all the sites [4]. Comparing FIGS. 1A and 1B with FIGS. 1C and 1D indicates that the $P_y$-versus-$E_y$ and $G_z$-versus-$E_y$ functions in the ferroelectric nanoring qualitatively differ from the hysteresis loops in the low-dimensional magnet. For instance, $P_y$ does not exhibit any jump, unlike $M_y$. Such differences hint that the states involved in the hysteresis loops of ferroelectric dots can differ from those occurring in the corresponding hysteresis loops of ferromagnetic rings. This is indeed confirmed by the insets of FIGS. 1C and 1D that display the schematization of four states of particular interest in ferroelectric nanorings. They are: state (5) which is a vortex state characterized by a significantly negative $G_z$ but that, unlike state (1), is polarized and happens for the largest negative field values; state (6) that differs from state (5) by having a much smaller polarization and, especially, by forming two vortices—one vortex that is reminiscent of state (5), and a second one that has nucleated inside the dot and that is not only of smaller dimension but also of opposite chirality than the first vortex. Such striking states can be classified as an antiferrotoroidic pair state [20]; state (7) that is also a vortex state as state (5), but of opposite sign for its $G_z$ and $P_y$, and that occurs for the largest positive investigated fields; and state (8) that resembles state (6) once reversing the chiralities of both the large and small vortices. FIGS. 1C and 1D thus reveal that it is also possible to control the chirality of vortices by applying homogeneous fields in asymmetric ferroelectric nanorings [21], via the transition to intermediate states—as in ferromagnetic rings. However, these intermediate states are not onion states but rather antiferrotoroidic in low-dimensional ferroelectrics. (We do not find any onion state in our investigated ferroelectric ring likely because of its small size and the fact that its short-range interactions are rather small with respect to its dipole-dipole interactions [22].) Interestingly, states (6) and (8) were found to first deform themselves via the growth in size of their second vortex before transforming into the vortex states (7) and (5), respectively. Furthermore, we did not find any systematic controllable switching of the vortex chirality when applying homogeneous electric fields in ferroelectric nanorings that are symmetric. This leads us to address the two following questions: (i) how can homogeneous magnetic and electric fields control magnetic or ferroelectric vortices, respectively, while these fields are not allowed to directly couple with the magnetic or electrical toroidal moments [4]—as symmetry arguments tell us (the electric field is a polar vector while the electric toroidal moment is an axial vector. Conversely, the magnetic field is an axial vector while the magnetic toroidal moment is polar); and (ii) why does such control only occur in asymmetric systems?

To answer these questions, let us first define a vector, R, characterizing the system's asymmetry. For instance, for our investigated asymmetric nanorings, one can introduce the following vector representing the asymmetric-induced shift in center of gravity of the whole ring: $R=x\, r^2 S/(L^2−r_2)$, where x is the unit vector along the x-axis. The cross-product of this vector with the magnetic field, R×B, has exactly the same symmetry as the magnetic T toroidal moment since both are polar vectors breaking the time symmetry. One can thus consider, on sole symmetry grounds, an interacting energy in asymmetric ferromagnets that is directly proportional to (R×B)·T. Such energy is non-zero in our particular cases because (i) the dot is asymmetric (i.e., S and thus R do not vanish), (ii) R is oriented along the x-axis, while B is along the y-axis and T lies along the z-axis. The existence of such new energy is numerically confirmed by performing calculations in which R and B are purposely chosen to lie along the same axis (in that case, we did not find any possible control of the chirality of the magnetic vortices) or in which the magnitude of R is increased (in that case, it easier to switch the vortex chirality, that is one needs a smaller magnetic field for that switching). Thus, R×B can be considered as a field able to interact with the T magnetic toroidal moment in asymmetric ferromagnets. Similarly, R×E can be thought as a physical object that can control the chirality and magnitude of the electric toroidal moment, G, via an interacting energy proportional to (R×E)·G in asymmetric ferroelectrics. Note that the cross-product of R and the E electric field is an axial vector, exactly like the electric toroidal moment [6], which explains why symmetry arguments allows it to interact with G.

In summary, we used computational schemes to (1) reveal that homogeneous electric fields are capable of controlling the chirality and magnitude of electric vortices in asymmetric zero-dimensional ferroelectrics, with such control involving original intermediate states; (2) to undoubtedly establish that the shape asymmetry is playing a crucial role in the control of vortices via homogeneous fields; (3) to explain why such controls are possible by proving that the magnetic (respectively, electric) vortex directly interacts with an overlooked physical object, namely with the cross product of a vector characterizing the system's asymmetry and the homogeneous magnetic (respectively, electric) field. These energy terms that are proportional to (R×B)·T and (R×E)·G also open the way for attractive new technologies, e.g. to make nanomotors from asymmetric rings. As a matter of fact, purposely choosing a R×B (respectively, R×E) vector that does not initially lie along the same direction than T (respectively, G) will force the ring to rotate if this ring is free to do so—in the same manner that a macroscopic magnet can rotate when subject to an homogeneous field lying away from its magnetization [23]. That for a continuously rotating nanomotor, the magnetic or electric field must continue to rotate so that the ring must follow. This statement must be qualified by the fact that once the rotor is up to synchronous speed, a field oscillating along one axis will suffice.

The use of the asymmetrical ultrathin nanoscale ferroelectric or mesoscale magnetic ring allows the application of a homogeneous field to redirect the dipole vortex so to write this information into a nonvolatile memory device. This approach is an effective writing procedure that allows the use of simple devices such as electromagnets (for magnets) or electric batteries (for ferroelectrics) to accomplish the control of dipole vortices.

The advantage of ferroelectric memory devices operated with the principle of this invention is a possibly extremely high density of memory elements because of the extremely small size of a ferroelectric nanoring possessing the desired dipole structure. The minimal size of one memory element may be on the order of 4 nm. The elements do not produce any field which solves the problem of the influence of one memory element on another one.

Our calculations demonstrate a very high speed of switching (in the microwave region, at GHz frequency), which is a special advantage of the present invention.

In contrast with the usual ferroelectric devices such as electromechanical transducers, the present invention does not suffer from the presence of a surface layer because the dipoles are arranged so to look in parallel to the surface (the perpendicular direction of the dipoles in the transducers make them dependable on the surface).

Besides nanoscale memory devices, the present invention has applications in new types of nanotransducers, nanomotors, and nanoswitchers. A new kind of nanotransducer operating with the help of the dipole vortices was suggested by in S. Prosandeev, I. Kornev and L. Bellaiche, PHYSICAL REVIEW B 76, 012101, Tensors in ferroelectric nanoparticles: First-principles-based simulations, (2007).

Summarizing, the advantages of the present invention include the following:

i) The use of easily created homogeneous electric (for ferroelectrics) and magnetic (for magnets) field to control dipole vortices.

ii) Extremely high density of memory elements reachable because of the extremely small size of the ferroelectric nanorings possessing the desired dipole structure. The magnetic devices can be made at mesoscale.

iii) The elements do not produce any field around that solves the problem of the influence of one memory element on another one. Very high speed switching is demonstrated by our calculations (in the microwave region, at GHz frequency).

iv) The present invention does not suffer from the presence of a surface layer because the dipoles are arranged so to look in parallel to the surface.

The present invention has been described with reference to certain preferred and alternative embodiments that are intended to be exemplary only and not limiting to the full scope of the present invention as set forth in the appended claims.

REFERENCES

[1] C. L. Chien, F. Q. Zhu and J-G Zhu, Physics Today 60, No. 6, 40 (2007).

[2] I. Naumov, L. Bellaiche and H. Fu, Nature 432, 737 (2004).

[3] I. Ponomareva et al., Phys. Rev. B 72, 140102 (R) (2005); I. Ponomareva et al., Phys. Rev. B 72, 214118 (2005).

[4] V. M. Dubovik and V. V. Tugushev, Phys. Rep. 187, 145 (1990).

[5] H. Schmid, Ferroelectrics 252, 41 (2001).

[6] S. Prosandeev et al., Phys. Rev. Lett. 96, 237601 (2006).

[7] S. Prosandeev and L. Bellaiche, Phys. Rev. B 75, 094102 (2007).

[8] J. Rothman et al., Phys. Rev. Lett. 86, 1098 (2001).

[9] H. Hoffmann and F. Steinbauera, J. Appl. Phys. 92, 5463 (2002).

[10] M. E. Schabes and H. N. Bertram, J. Appl. Phys. 64, 1347 (1988).

[11] V. P. Antropov, S. V. Tretyakov, and B. N. Harmon, J. Appl. Phys. 81, 3961 (1997).

[12] H. Fu and L. Bellaiche, Phys. Rev. Lett. 91, 257601 (2003).

[13] L. Bellaiche, A. Garcia, and D. Vanderbilt, Phys. Rev. Lett. 84, 5427 (2000); Ferroelectrics 266, 41 (2002).

[14] E. Almahmoud et al., Phys. Rev. B 70, 220102 (R) (2004).

[15] We choose frequencies for the ac fields that are below the resonant frequencies to be in the quasi-adiabatic regime. Such resonant frequencies are numerically found to be in the order of THz for the studied ferroelectric nanorings and are known to be around GHz in ferromagnetic rings having the type of presently investigated size [16].

[16] F. Giesen, J. Podbielski, B. Botters, and D. Grundler, Phys. Rev. B 75, 184428 (2007).

[17] I. Fedorov et al., J. Phys. Condens. Matter 7, 4313 (1995).

[18] F. Q. Zhu et al., Phys. Rev. Lett. 96, 027205 (2006).

[19] Note that the vortex in our investigated ferroelectric nanoring can be thought as being made of four different domains, each having dipoles aligned along a specific (100) direction, with 90° domain walls between two successive domains (see FIG. 1 of Ref. [7]). On the other hand, the dipoles of the vortex in the investigated ferromagnetic nanoring exhibit a much more continuous rotation pattern. Such difference can be attributed to the importance of crystal anisotrophy in ferroelectrics.

[20] S. Prosandeev and L. Bellaiche, Phys. Rev. Lett. 97, 167601 (2006).

[21] The magnitude of the electric field needed to reverse the vortex's chirality in ferroelectric dots is numerically found to be dependent on various factors, such as the dimensions and shape of the dot, as well as the degree of screening of the depolarizing field.

[22] The fact that vortices occur in dots of smaller size in ferroelectrics than in magnets implies that ferroelectric rings have the promise to generate memory devices of much higher density than ferromagnets [2].

[23] J. Hamilton, A Life of Discovery: Michael Faraday, Giant of the Scientific Revolution. New York: Random House (2004).

What is claimed is:

1. A device, comprising:
    a dipolar ring surrounding an interior region;
    said dipolar ring generating a toroidal moment;
    said interior region being disposed asymmetrically with respect to said dipolar ring;
    said dipolar ring characterized by a plane; and
    a homogeneous field applied to said dipolar ring in said plane.

2. The device of claim 1, wherein said dipolar ring is characterized by a center of gravity and a vector R characterizes a shift in said center of gravity of said dipolar ring and further wherein said toroidal moment interacts with a cross product of said vector R and said homogeneous field.

3. The device of claim 1, wherein said toroidal moment is switchable between at least two stable states by said homogeneous field.

4. The device of claim 1, wherein said dipolar ring comprises ferroelectric material.

5. The device of claim 1, wherein said dipolar ring comprises magnetic material.

6. The device of claim 4, wherein said dipolar ring is nanoscale in size.

7. The device of claim 5, wherein said dipolar ring is mesoscale in size.

8. The device of claim 4 comprising PZT.

9. The device of claim 5 comprising permalloy.

10. The device of claim 1, wherein said homogeneous field is an electric field.

11. The device of claim 1, wherein said homogeneous field is a magnetic field.

12. The device of claim 1, wherein said dipolar ring is mounted for rotation and said field is an oscillating field.

13. The device of claim 1, wherein said dipolar ring is mounted for rotation and said file is a rotating field.

* * * * *